US007217145B2

(12) United States Patent
Lemkuil

(10) Patent No.: US 7,217,145 B2

(45) Date of Patent: May 15, 2007

(54) SAFETY PLUGS FOR CYLINDRICAL OPENINGS

(76) Inventor: Daniel J. Lemkuil, 5103 Stillbrooke Dr., Houston, TX (US) 77035

( * ) Notice: Subject to any disclaimer, the term of this patent is extended or adjusted under 35 U.S.C. 154(b) by 0 days.

(21) Appl. No.: 11/214,110

(22) Filed: Aug. 29, 2005

(65) Prior Publication Data

US 2006/0051991 A1 Mar. 9, 2006

Related U.S. Application Data

(63) Continuation-in-part of application No. 10/666,298, filed on Sep. 19, 2003, now Pat. No. 6,953,353.

(51) Int. Cl.
*H01L 21/332* (2006.01)

(52) U.S. Cl. .................................................... 439/133

(58) Field of Classification Search ................ 439/148, 439/134, 346, 133; 220/237, 3.8, 242; 215/212
See application file for complete search history.

(56) References Cited

U.S. PATENT DOCUMENTS

| | | | | |
|---|---|---|---|---|
| 2,446,661 | A * | 8/1948 | Murdock | 215/303 |
| 2,966,276 | A * | 12/1960 | Hing | 215/270 |
| 5,797,431 | A * | 8/1998 | Adams | 138/89 |
| 6,170,530 | B1 * | 1/2001 | Steblina | 138/89 |
| 2004/0187945 | A1 * | 9/2004 | Flanagan | 138/89 |

* cited by examiner

*Primary Examiner*—Tho D. Ta
*Assistant Examiner*—Vanessa Girardi
(74) *Attorney, Agent, or Firm*—Osha Liang LLP

(57) ABSTRACT

A safety plug includes a body configured to be inserted into a cylindrical opening. A locking device is connected to an end of the body, wherein the locking device has a larger diameter than the cylindrical opening in which the body is configured to be inserted. Following insertion into the cylindrical opening, the locking device resists removal of the safety plug. A control device is operatively coupled to the locking device, wherein pushing the control device towards the locking device while pulling on the body disengages the locking device from cylindrical opening.

14 Claims, 4 Drawing Sheets

SAFETY PLUGS FOR CYLINDRICAL OPENINGS

CROSS-REFERENCE TO RELATED APPLICATIONS

This application is a continuation in part of U.S. patent application Ser. No. 10/666,298 filed on Sep. 19, 2003 now U.S. Pat. No. 6,953,353, and entitled “Safety Plugs for Power Ports.” That application is incorporated herein by reference in its entirety.

BACKGROUND OF INVENTION

1. Field of the Invention

The invention relates generally to plugs for power ports. More particularly, the invention relates to safety plugs with a child-resistant mechanism.

2. Background Art

With more and more electronic devices, such as personal radios, cassette players, CD players, televisions, and DVD players, proliferating to our living environment outside the homes, new cars and boats often are equipped with multiple power ports. The days of having only one power port to be shared between a cigarette lighter and other electronic devices seem to be gone. While the additional power ports provide convenience to the users, they may present hazards to small children.

The additional power ports in the automobiles or boats are typically covered with simple devices to prevent foreign objects from being accidentally introduced into them. FIG. 1 shows one example of a typical cover used in most power ports. As shown, a cover 52, which is typically made of plastic, is attached to the opening 53 of the power port 51. The cover 52 is pressed into the opening 53 to close the power port. The cover 52 engages the power port by interference fit and can be easily removed by a curious child.

Once the cover 52 is opened, the electrical terminals (not shown) inside the power port 51 become accessible to the curious little hands and fingers. A child may stick his fingers into the power port. This may result in injuries to the child. Alternatively, the child may shove foreign objects into the power port. If paper clips or liquids are introduced into the power port, damages may result to the automobiles or boats, and the child may be injured.

Therefore, it is desirable that better power port covers or plugs that cannot be easily removed by children are available. In addition, it is desirable that such covers or plugs may serve other useful functions.

SUMMARY OF INVENTION

In one aspect, the present invention relates to a safety plug. The safety plug includes a body configured to be inserted into a cylindrical opening. A locking device is connected to an end of the body, wherein the locking device has a larger diameter than the cylindrical opening in which the body is configured to be inserted. Following insertion into the cylindrical opening, the locking device resists removal of the safety plug. A control device is operatively coupled to the locking device, wherein pushing the control device towards the locking device while pulling on the body disengages the locking device from cylindrical opening.

In another aspect, the present invention relates to a safety plug that includes a body, a rubber skirt disposed at an end of the body, and a plunger shaft passing through both the body and the rubber skirt. The plunger knob is disposed on an end of the plunger shaft. A spring is disposed in the body and configured to bias the plunger shaft such that the rubber skirt has an outer diameter selected to be larger than a cylindrical opening in which the safety plug is to be inserted. The safety plug is configured to be released from the cylindrical opening by pushing the plunger knob while pulling on the body.

Other aspects and advantages of the invention will be apparent from the following description and the appended claims.

DETAILED DESCRIPTION

Embodiments of the invention relate to safety plugs for power ports, such as those found in automobiles and boats. A safety plug in accordance with embodiments of the invention includes a locking device. The locking device can be disengaged by a control device with a child-resistant mechanism. Therefore, a safety plug in accordance with embodiments of the invention can prevent children from pulling the safety plug out of a power port.

Figure 1:
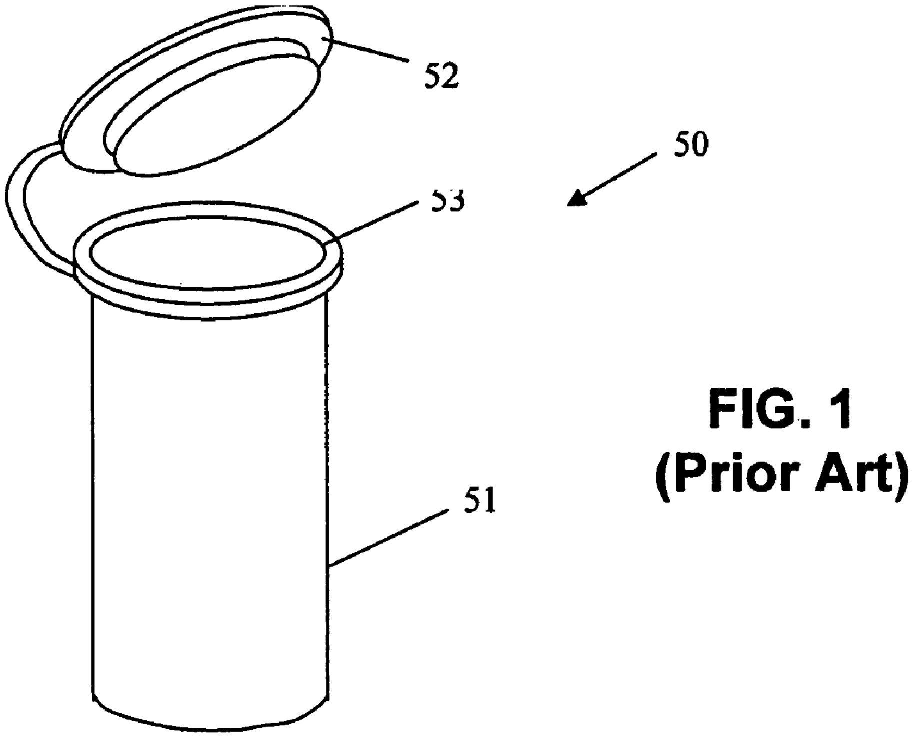
FIG. 1 (Prior Art)
FIG. 1 shows a prior art power port cover attached to a mobile power port.
Figure 2:
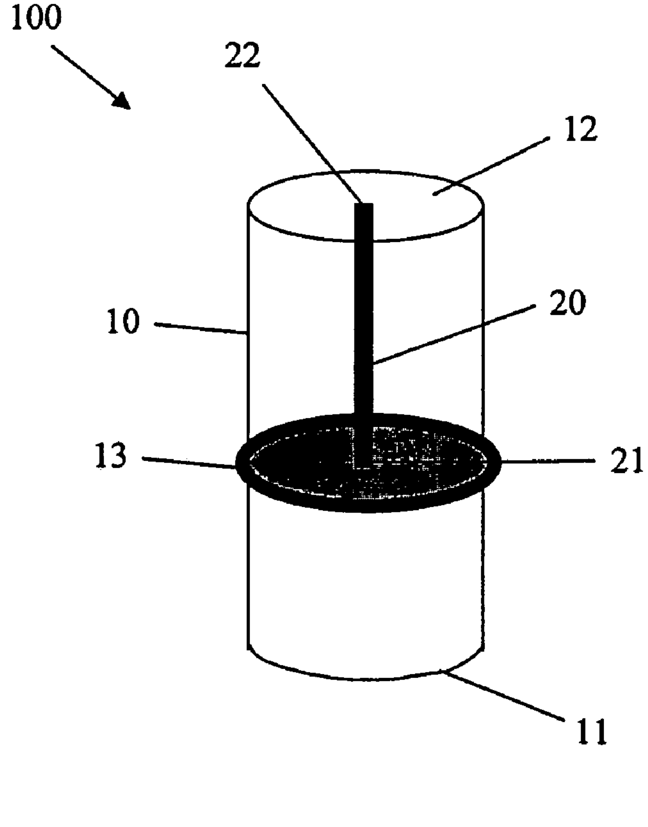
FIG. 2 shows a schematic of a safety plug in accordance with one embodiment of the invention.

FIG. 2 illustrates a schematic of a safety plug in accordance with one embodiment of the invention. As shown, the safety plug 100 comprises a body 10 that has a first end 11 and a second end 12. The first end 11 of the safety plug 100 is adapted to be inserted into a power port (or electric socket, shown as 51 in FIG. 1). The safety plug 100 also includes a locking device 13, which is controlled by a control device 20.

The locking device 13 engages the inside of the power port (socket) to prevent it from being removed. In preferred embodiments, the locking device 13 is configured to the locked state by default. Alternatively, the locking device 13 may be switched to the locked state after it is inserted into a power port. To remove the safety plug 100 from the power port, the control device 20 is activated. Activation of the control device 20 disengages the locking device 13 and converts it to the unlocked state to allow the safety plug 100 to be removed.

In accordance with embodiments of the invention, the control device 20 has a child-resistant mechanism that may be activated in a counter-intuitive manner such that a child is less likely to pull the safety plug 100 out of the power port. Examples of child-resistant mechanisms may include the following. The control device 20 may need to be “pushed” in, while the safety plug 100 is being “pulled” out of the power port. The control device 20 may need to be turned to a specific angular position, like a child-resistant medicine bottle, before the safety plug 100 can be removed from the power port, The control device 20 may need to be turned to one direction and then the other, like a combination lock, before the locking mechanism 13 is disengaged from inside the power port. One of ordinary skill in the art would appreciate that other variations of the child-resistant mechanism may be used with embodiments of the invention, and, therefore, the invention is not limited to these specific examples.

The control device 20, which may include a shaft slidably disposed in the body 10, is attached at its first end 21 to the locking device 13, while the second end of the control device 22 may protrude from the second end 12 of the body 10 of the safety plug 100. The protrusion of the second end 22 allows a force to be applied to rotate or push the control device 20 towards the first end 11 of the body 10. Thus, the force needed to unlock the locking device 13 is applied in an opposite or orthogonal direction relative to the force needed to pull the safety plug 100 out of a power port.

Figure 3:
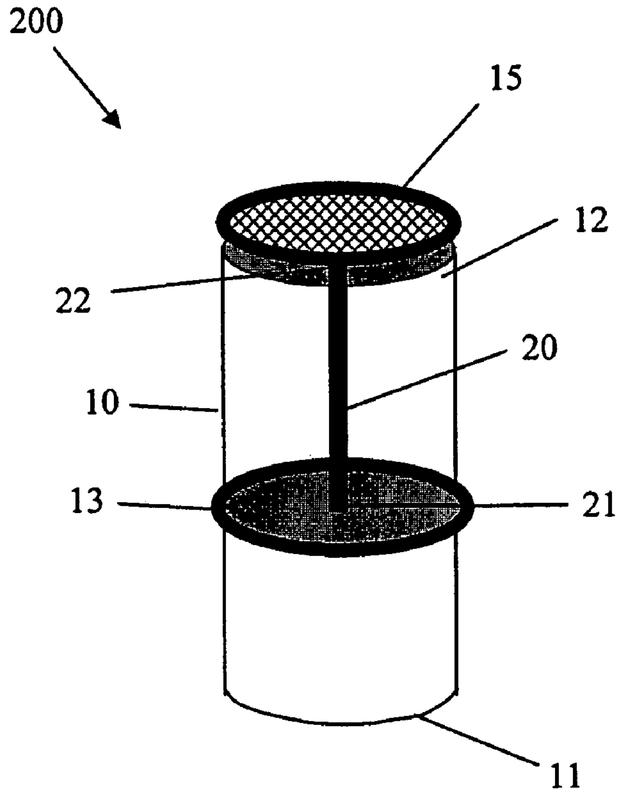
FIG. 3 shows a safety plug in accordance with another embodiment of the invention.

FIG. 2 illustrates minimum features of a safety plug 100 in accordance with one embodiment of the invention. According to some embodiments of the invention, the safety plug may further include other components to enhance its utility. As shown in FIG. 3, a safety plug 200 in accordance with one embodiment of the invention also includes an attachment 15. The attachment 15 may be attached to the second end 12 of the body 10 or to the second end 22 of the control device 20. If the attachment 15 is attached to the second end 12 of the body 10, then it may have an opening to allow access to the control device 20. Alternatively, the control device 20 may protrude from the side of the attachment 15.

The attachment 15 may be any item that enhances the utility and/or aesthetic of the safety plug 200, such as a picture, a display, a sign (e.g., a no smoking sign), an air freshener, a clock, or a connector for other electronic devices. If the attachment 15 is (or is for) an electronic or electrical device, such as a clock or any electronic device, or a connector for such a device, then the safety plug 200 may include conductors (electrical contacts) to transmit electricity from the power port. Examples of a display may include light-emitting diode display, a liquid-crystal display, a thin-film-transistor display, and a plasma display. Examples of an electrical connector may include a jack for a stereo mini plug, a jack for an RCA plug, etc.

Figure 4:
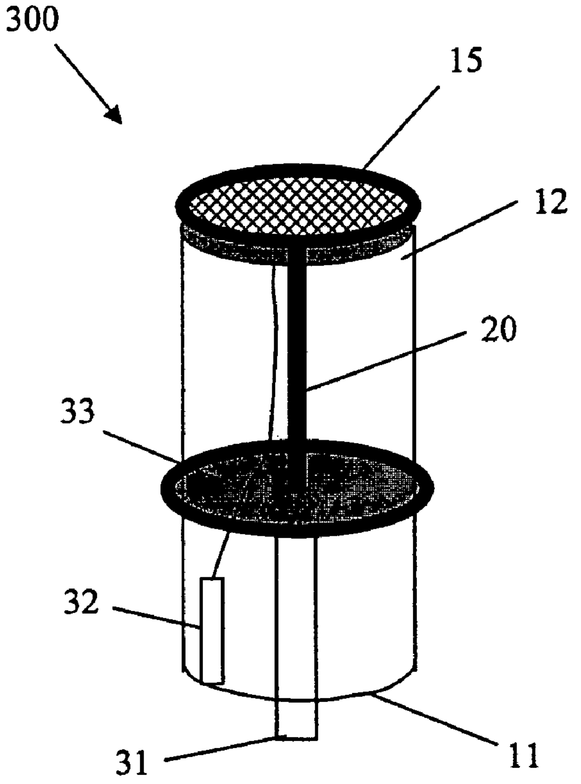
FIG. 4 shows a safety plug in accordance with another embodiment of the invention.

FIG. 4 shows a safety plug 300 in accordance with another embodiment of the invention. As shown, the safety plug 300 includes two conductors (electrical contacts) 31, 32 and a wire 33 for providing electrical power to the attachment 15. As shown, the electrical contact 31 is adapted to contact the positive terminal in the power port and the electrical contact 32 is to provide a current return. The current return electrical contact 32 may not be needed, if the body 10 is made of a conductive material and can provide the conductive path. If the control device 20 is made of a conductive material, the electrical contact 31 may be connected directly to the control device 20. Otherwise, the electrical contact 31 may be connected to the attachment 15 via a conductive wire (not shown).

Figure 5:
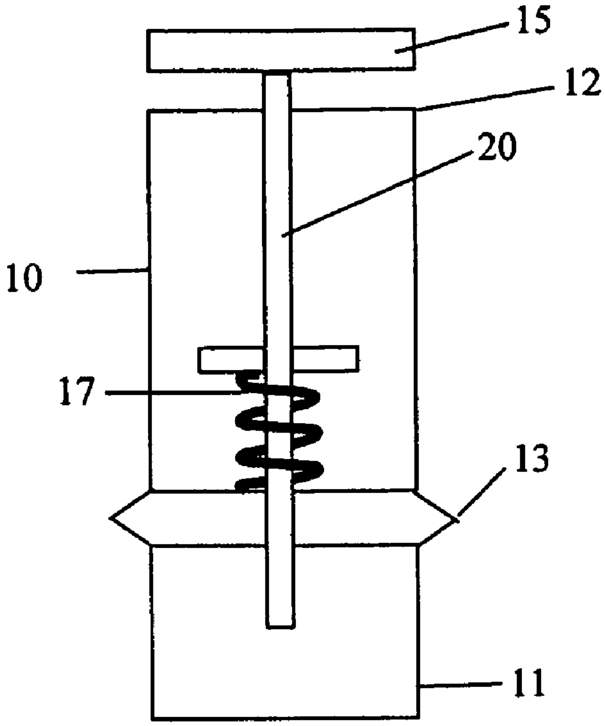
FIG. 5 shows a safety plug illustrating a locking device in accordance with one embodiment of the invention.

The locking device 13 may use any reversible mechanism that can prevent the safety plug from being pulled out of a power port by a child. FIG. 5 shows one embodiment of a locking device 13 that comprises an adjustable diameter member. As shown, the locking device 13 is made of a flexible material that is disposed between the first end 11 and the second end 12 of the body 10. The flexible material, for example, may be rubber, plastic, or the like. The flexible material permits the locking device 13 to change its diameter. While a single fold structure is illustrated for the locking device 13 in FIG. 5, one of ordinary skill in the art would appreciate that other configurations may be employed without departing from the scope of the invention. For example, the locking device 13 may have multiple folds as in an accordion, or other suitable structures.

As shown in FIG. 5, a spring 17 is provided to bias the control device 20 in the up position so that the locking device 13 is at its maximum diameter (i.e., the locked state). To unlock the safety plug 400 from a power port, the diameter of the locking device 13 can be reduced by pressing the control device 20 towards the first end 11 of the body 10. Thus, to remove the plug, two forces of opposite directions need to be applied. This counter-intuitive mechanism can prevent a child from pulling the safety plug out of a power port without adult assistance.

The embodiment shown in FIG. 5 is for illustration only, other configurations of the locking device 13 are possible. For example, the locking device 13 may have selected portions protruding from slots cut in the body 10. Alternatively, the locking device 13 may not be made of a flexible material.

Figure 6:
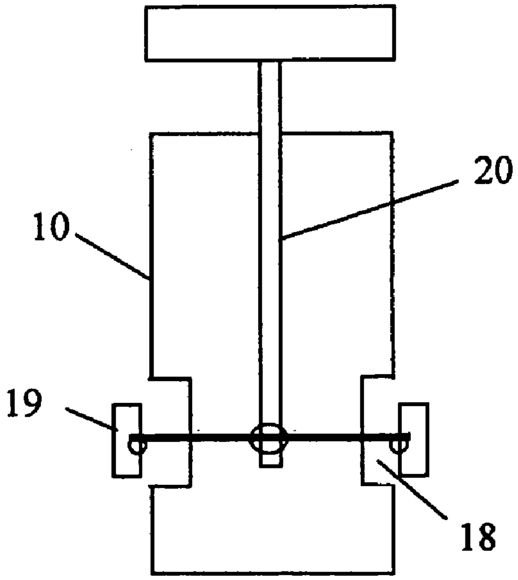
FIG. 6 shows a safety plug illustrating another locking device in accordance with one embodiment of the invention.

FIG. 6 shows another embodiment of the locking device 13 that comprises one or more protruding members 19 adapted to extend from the body 10 to engage a power port (not shown). The protruding members 19 are linked to the control device 20 by levers 18 such that when the control device 20 is pushed in, the protruding members 19 are pulled towards the body 10 to disengage the safety plug from a power port (not shown). The levers 18 and the protruding members 19 shown in FIG. 6 are for illustration only. One of ordinary skill in the art would appreciate that many modifications are possible without departing from the scope of the invention. For example, the protruding members 19 may be hinged at one of its ends to the body 10, and the levers 18 may be replaced by springs. The levers or springs 18 are generally referred to as a "retracting mechanism" in this description.

Figure 7:
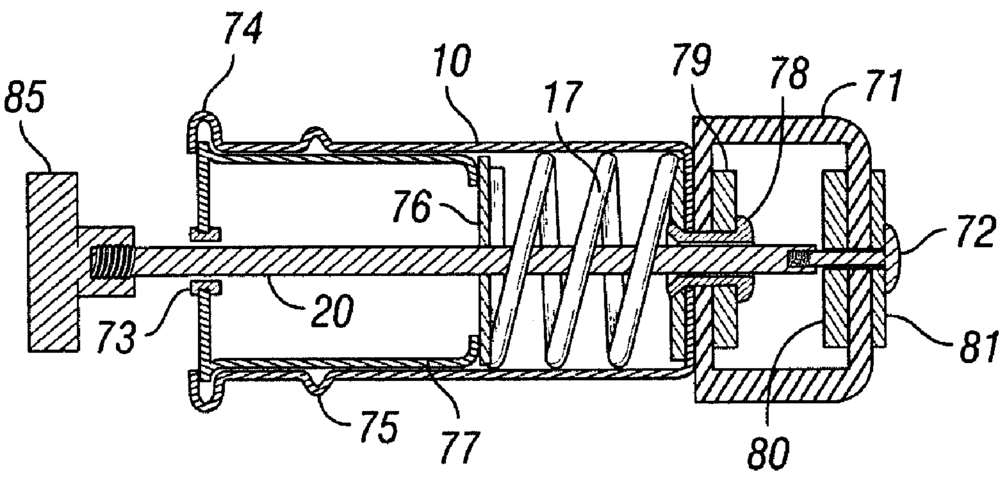
FIG. 7 shows a cross-section of a safety plug in accordance with another embodiment of the present invention.

Turning to FIG. 7, a safety plug in accordance with an embodiment of the present invention is shown. In this particular embodiment, the safety plug has a rubber skirt 71 at the end of the body 10. To assemble the safety plug, threads and washers may be used. To assemble the embodiment shown in FIG. 7, the control device 20 (a "plunger shaft" in this embodiment) has a threaded end to receive an expansion screw 72, which attaches the rubber skirt 71 to the plunger shaft 20. Washers 80 and 81, which are made of a harder material such as plastic or metal, may be position on the inside and outside of the rubber skirt 71 to prevent tearing and to securely hold the rubber skirt 71 on the body 10. A grommet 78 may be included around the plunger shaft 20 at the intersection of the rubber skirt 72 and the body 10. The grommet 78 helps to guide the plunger shaft 20 during actuation of the safety plug. A washer 78 may also be included at the intersection of the rubber skirt 72 and the body 10 to prevent tearing of the rubber skirt 71. A plunger knob 85 may be threaded on the end of the plunger shaft 20 to be able to grip and actuate the safety plug. Those having ordinary skill in the art will appreciate that components may be molded together instead of assembled with the washers and threaded components shown in FIG. 7.

The safety plug shown in FIG. 7 is spring loaded using a spring 17, which is stored in a relaxed or partially compressed state inside the body 10 between a spring plate 76 and the end of the body 10. The spring plate 76 may be connected to the plunger shaft 20, such that the spring 17 biases the plunger knob in an outer position and causes the expansion screw 72 to pull in on the rubber skirt 71, thereby expanding the outer diameter of the rubber skirt 71. To preload the spring 17, the body 10 may house a spring retainer 77, which may be kept in place by a crimp 74 on the body 10. The spring retainer 77 may further include a grommet 73 to guide the plunger shaft 20.

The safety plug in FIG. 7 may be used by inserting the safety plug into a generally cylindrical opening, such as a power port (or cigarette lighter) in a vehicle or a pipe. The rubber skirt 71 may be sized such that, absent pushing on the plunger, the rubber skirt 71 will interfere with the cylindrical opening in which it is inserted. This state may be accomplished by partially compressing the spring 17 during assembly of the safety plug, such that the plunger shaft 20 (using the expansion screw 72 in this embodiment) pulls on the rubber skirt 71 to expand the outer diameter of the rubber skirt 71. Instead of, or in addition to, partially compressing the spring 17, the relaxed state of the rubber skirt 71 may be sized to interfere with the cylindrical opening. The rubber skirt 71 should be made of a material that has sufficient friction between it and the cylindrical opening in which the safety plug is to be inserted. For cylindrical openings made of metal, such as a power port in a vehicle, a material such as gum rubber may be used.

After being inserted into the cylindrical opening by a selected amount, the safety plug is automatically secured. If further insertion is desired, the plunger knob 85 may be pushed to stretch the rubber skirt 71 and allow further insertion into the cylindrical opening. To prevent over-insertion of the safety plug, the body 10 may include an upset 75 that will limit the insertion depth of the safety plug. The maximum depth of insertion may be selected such that the plunger knob 85 and part of the body 10 extend out of the cylindrical opening and the plunger shaft 20 is still able to actuate to extend the rubber skirt 71.

Following insertion of the safety plug, pulling on the plunger knob 85 will not be able to easily remove the safety plug. By pulling on the plunger knob 85, the rubber skirt 71 is compressed and expanded, resulting in increased friction between the outer diameter of the rubber skirt 71 and the inner diameter of the cylindrical opening. Removal of the safety plug requires the non-intuitive motion of pushing the plunger knob 85 to extend and reduce the outer diameter of the rubber skirt 71, while also pulling on the portion of the body 10 that extends beyond the upset 75. This motion may be easily accomplished by a person of typical dexterity that is aware of how the safety plug is actuated, but would not be obvious to most children. For a safety plug configured for a power port in a vehicle, the actuation could be accomplished by pinching the body 10 between two fingers and pulling on the body 10 while pushing the plunger knob 85 with the thumb on the same hand.

The materials for the components of the safety plug may be selected depending on the application. For embodiments having a plunger knob with no electrical features, the body and plunger shaft may be coated with or made of non-conductive materials, such as plastic. In some embodiments, the rubber skirt may be replaced by a flexible plastic in a similar shape. Further, the rubber skirt may not have a smooth outer diameter, and may instead have ridges or bumps to aid in gripping the cylindrical opening. In some embodiments, the plunger knob may be decorated with a sign or logo of a sports team or company. In other embodiments, the sign or logo may be illuminated and powered by a power port in a vehicle. In embodiments with an illuminated plunger knob, conductive materials may be inside the plunger shaft to provide power to the plunger knob. For example, the plunger shaft may have a copper core inserted into a plastic sleeve. Part of the body may be conductive as well. In addition to or instead of an illuminated plunger knob, a wire having an electrical connection may extend from the plunger shaft to serve as an adapter for another electrical device, such as a music player or other personal entertainment device. This would allow a parent to provide power to a child's toy, while helping to protect the child from pulling out the safety plug and risking injury.

In other embodiments, the safety plug may be designed for use in pipes. The rubber skirt may be designed to hermetically seal against gas or liquid inside a pipe having an open end. If a very tight seal is required such that actuation by a person is difficult due to the stiffer spring and rubber skirt, the plunger shaft could be hydraulically or pneumatically actuated by adding a pressurized fitting to the plunger knob. Those having ordinary skill in the art will be able to design a suitable actuation device. Because of the flexibility of a rubber skirt, out of round or rough surfaces of a pipe may still be sealed by a safety plug in accordance with an embodiment of the present invention.

Advantages of the invention may include the following. A safety plug in accordance with the invention can be easily deployed to block a power port to prevent potential injuries to children. A safety plug of the invention has a locking device with a child-resistant control mechanism that unlocks the locking device in a counter-intuitive manner. Therefore, children are not expected to be able to remove the safety plugs from the power ports. In addition, a safety plug of the invention may further provide other functions such as a sign or a display. The safety plug may also provide a conduit to the power terminals in the power port such that other electrical or electronic devices may be conveniently connected.

While the invention has been described with respect to a limited number of embodiments, those skilled in the art, having the benefit of this disclosure, will appreciate that other embodiments can be devised which do not depart from the scope of the invention as disclosed herein.

What is claimed is:

1. A safety plug, comprising:

a body configured to be inserted into a mobile power port;

a locking device connected to an end of the body, wherein the locking device has a larger diameter than the mobile power port in which the body is configured to be inserted and resists removal of the safety plug from the mobile power port following insertion; and a control device operatively coupled to the locking device, wherein pushing the control device towards the locking device while pulling on the body disengages the locking device from the mobile power ports, wherein the safety plug is configured to conduct electricity through the control device.

2. The safety plug of claim 1, wherein the locking device is a rubber skirt having an outer diameter greater than the mobile power port.

3. The safety plug of claim 2, wherein the control device comprises a plunger shaft connected to a plunger knob on one end and the rubber skirt on a second end.

4. The safety plug of claim 3, wherein the safety plug is configured such that pushing the plunger knob towards the rubber skirt reduces the outer diameter of the rubber skirt to be smaller than the mobile power port.

5. The safety plug of claim 4, wherein the safety plug is configured such that friction between the outer diameter of the rubber skirt and the mobile power port is increased by pulling on the plunger knob.

6. The safety plug of claim 1, wherein the control device comprises a plunger knob that is configured to be powered by the mobile power port.

7. The safety plug of claim 1, wherein the plunger knob comprises at least one of a display, a clock, and a sign.

8. The safety plug of claim 1, wherein the control device comprises an adapter for an electrical device.

9. The safety plug of claim 1, wherein the control device comprises a display selected from a light-emitting diode display, a liquid-crystal display, a thin-film-transistor display, and a plasma display.

10. The safety plug of claim 1, wherein the body comprises an upset having a diameter greater than the mobile power port.

11. The safety plug of claim 1, further comprising:

a spring disposed in the body and configured to hold the locking device against the mobile power port.

12. A safety plug, comprising:

a body configured to be inserted into a cylindrical opening;

a locking device connected to an end of the body, wherein the locking device has a larger diameter than the cylindrical opening in which the body is configured to be inserted and resists removal of the safety plug from the cylindrical opening following insertion; and a control device operatively coupled to the locking device, wherein pushing the control device towards the locking device while pulling on the body disengages the locking device from the cylindrical opening;

wherein the cylindrical opening is a pipe, and wherein the safety plug is configured to conduct electricity through the control device.

13. A safety plug, comprising:

a body;

a rubber skirt disposed at an end of the body;

a plunger shaft passing through both the body and the rubber skirt, wherein a plunger knob is disposed on an end of the plunger shaft;

a spring disposed in the body and configured to bias the plunger shaft such that the rubber skirt has an outer diameter selected to be larger than a cylindrical opening in which the safety plug is to be inserted; and wherein the safety plug is configured to be released from the cylindrical opening by pushing the plunger knob while pulling on the body, and wherein the safety plug is configured to conduct electricity through the control device.

14. The safety plug of claim 13, wherein the plunger shaft is operatively coupled to the rubber skirt to reduce the outer diameter of the rubber skirt when the plunger knob is pushed.

* * * * *

UNITED STATES PATENT AND TRADEMARK OFFICE

CERTIFICATE OF CORRECTION

PATENT NO. : 7,217,145 B2 
APPLICATION NO. : 11/214110
DATED : May 15, 2007
INVENTOR(S) : Daniel J. Lemkuil It is certified that error appears in the above-identified patent and that said Letters Patent is hereby corrected as shown below:

In the Claims:

In Claim 1, column 6, line 51, the word "ports" should be --port,--.

Signed and Sealed this

Fourth Day of September, 2007

JON W. DUDAS
*Director of the United States Patent and Trademark Office*